(12) United States Patent
Kanaoka

(10) Patent No.: US 7,193,942 B2
(45) Date of Patent: Mar. 20, 2007

(54) PHASE DIFFERENCE CORRECTION APPARATUS AND DATA REPRODUCTION APPARATUS INCLUDING DATA HEADER DETECTION APPARATUS

(75) Inventor: Toshikazu Kanaoka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 73 days.

(21) Appl. No.: 11/038,315

(22) Filed: Jan. 18, 2005

(65) Prior Publication Data

US 2005/0122885 A1     Jun. 9, 2005

Related U.S. Application Data

(63) Continuation of application No. PCT/JP02/012531, filed on Nov. 29, 2002.

(51) Int. Cl.
   *G11B 7/00*     (2006.01)

(52) U.S. Cl. .............................. 369/47.35; 369/59.21

(58) Field of Classification Search ............ 369/124.05
   See application file for complete search history.

(56) References Cited

U.S. PATENT DOCUMENTS

| | | | | |
|---|---|---|---|---|
| 4,673,979 A | * | 6/1987 | Kobo et al. ................. | 348/464 |
| 5,946,154 A | | 8/1999 | Ino | |
| 6,052,350 A | * | 4/2000 | Kura ........................ | 369/59.15 |
| 2002/0027963 A1 | * | 3/2002 | Imanaka et al. ............. | 375/341 |
| 2002/0071194 A1 | * | 6/2002 | Honma ......................... | 360/51 |
| 2003/0011920 A1 | * | 1/2003 | Tsuchinaga .................. | 360/46 |

FOREIGN PATENT DOCUMENTS

| | | |
|---|---|---|
| EP | 0 655 739 | 8/2000 |
| JP | 5-067375 | 3/1993 |
| JP | 5-250816 | 9/1993 |
| JP | 7-161139 | 6/1995 |

(Continued)

OTHER PUBLICATIONS

Electronic Translation of JP 2002-109836.*

*Primary Examiner*—Wayne Young
*Assistant Examiner*—Lixi Chow
(74) *Attorney, Agent, or Firm*—Greer, Burns & Crain, Ltd.

(57) ABSTRACT

It is an object of the present invention to provide a phase difference correction apparatus and a data reproduction apparatus including a data header detection apparatus that can synchronize the phase between a clock for reproducing data and an optimum sampling point of a reproduction signal with high accuracy and thus precisely detect a header of reproduced data even in a case where the S/N ratio of a signal is low. In order to achieve the object, a data reproduction apparatus for sampling a reproduction signal reproduced from an information medium with a predetermined sample clock including an A/D converter apparatus for sampling the reproduction signal with the sample clock, a phase difference detection part for detecting a phase difference between an optimum sampling point of a sample signal sampled by the A/D converter part, and a phase difference correction apparatus including an optimum phase difference correction part for correcting a phase of a sampling point of the sample signal to an optimum phase according to the phase difference detected by the phase difference detection part so that the sample signal becomes a signal sampled at the optimum sampling point is provided.

12 Claims, 14 Drawing Sheets

FOREIGN PATENT DOCUMENTS

| | | |
|---|---|---|
| JP | 7-320414 | 12/1995 |
| JP | 8-63904 | 3/1996 |
| JP | 8-153371 | 6/1996 |
| JP | 2002-109836 | 4/2002 |
| JP | 2002109836 A * | 4/2002 |
| JP | 2002-175673 | 6/2002 |

* cited by examiner

FIG.2A
PRIOR ART
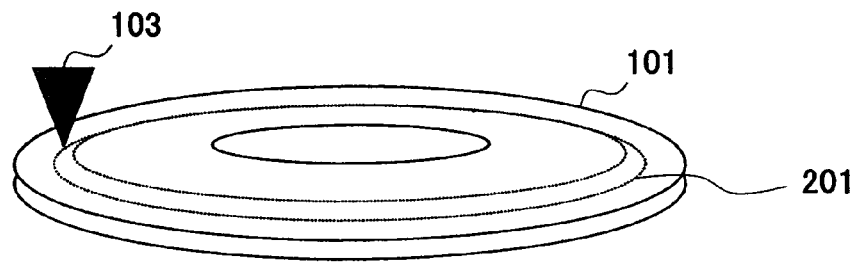
FIG.2B
PRIOR ART
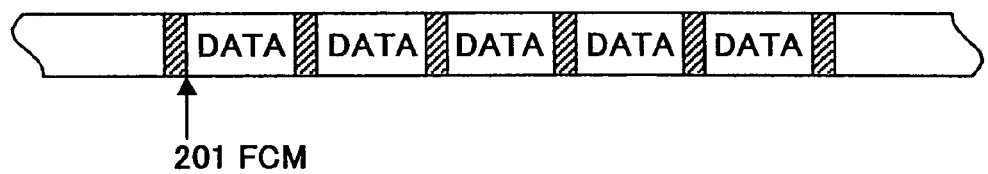
201 FCM
FIG.2C
PRIOR ART
FCM DETECTION SIGNAL 123
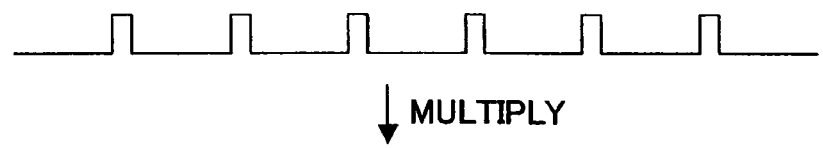
↓ MULTIPLY
FCM MULTIPLICATION CLOCK SIGNAL 124

PHASE DIFFERENCE CORRECTION APPARATUS AND DATA REPRODUCTION APPARATUS INCLUDING DATA HEADER DETECTION APPARATUS

CROSS-REFERENCE TO RELATED APPLICATIONS

This application is a U.S. continuation application filed under 35 USC 111(a) claiming benefit under 35 USC 120 and 365(c) of PCT application JP2002/012531, filed Nov. 29, 2002. The foregoing application is hereby incorporated herein by reference.

BACKGROUND OF THE INVENTION

1. Field of the Invention

The present invention relates to a data reproduction apparatus, and more particularly, an apparatus for detecting and correcting phase difference between signals and an apparatus for detecting a header of data.

2. Description of the Related Art

There is a desire for transferring and recording vast amounts of information since considerable amounts of information are handled in many fields, for example, in data communication apparatuses (e.g. mobile phones, satellite communication) and data recording/reproduction apparatuses for optical disks and magnetic disks.

With a conventional data reproduction apparatus for optical disks or magnetic disks, for example, a synchronizing signal indicating the header of recorded data is first required to be reproduced for restoring reproduced data into binary information data. The synchronous signal is reproduced by using a PLL (Phase Locked Loop) circuit. The simple principle of the PLL uses a VCO (Voltage Control Oscillator) for generating a clock signal, which serves as a reference for digitizing the reproduction signal, comparing the phase of the clock signal and the phase of the reproduction signal, and adjusting the phase of the clock signal generated from the VCO so that the phases come to have a predetermined relation.

Therefore, during phase lock of the reproduction signal, phase selection, and frequency synchronization, an initial phase detector is provided to detect phase difference between the reproduction signal and a sampling clock for sampling it.

FIG. 1 is a block diagram showing a reproduction system of a conventional data reproduction apparatus. The reproduction system of the data reproduction apparatus shown in FIG. 1 mainly includes: an optical head 102 which irradiates an optical beam 103 to an optical disk 101, receives light reflected from the optical disk 101, and converts this into electric signals; an AGC 104 and an analog equalizer 105 which receive signals output from the optical head 102; an A/D converter 106; a digital waveform equalizer 107; a decoder 108, a phase difference detector 110; a delay 111; a fine clock mark (FCM) detector 112; a PLL 113, and an address mark detector 114.

The reproduction system of the conventional data reproduction apparatus shown in FIG. 1 reproduces the MO signal 120 reproduced from the optical disk 101 into user data 130 by employing an external clock method.

Here, the external clock method, in the reproduction system of the conventional data reproduction shown in FIG. 1, does not generate a clock for reproducing data from the MO reproduction signal 120 itself including information data, but it is rather a method which generates a reproduction clock 124 using the PLL by synchronizing a signal (in FIG. 1, tangential push-pull signal 121) reproduced from a particular clock mark embedded in a medium to a signal 123 detected by the fine clock mark detector 112 in the PLL 113.

FIG. 2A is a drawing showing a fine clock mark (FCM) 201 recorded on the optical disk 101. Furthermore, FIG. 2B is a drawing showing a disk format of only a single extracted track. Furthermore, FIG. 2C is a drawing showing a principle generating the external clock signal 124 from the fine clock mark signal by using the PLL 113.

The fine clock mark (FCM) 201 shown in FIG. 2A is reproduced by applying the optical beam 103 from the optical head 102. FIG. 2B is a drawing showing the fine clock mark (FCM) reproduced by the optical head 102 from the optical disk 101. As shown in FIG. 2C, the reproduced fine clock mark (FCM) 201 is detected by the fine clock mark detector 112 and is output from the fine clock mark detector as an FCM detection signal 123 having the fine clock mark (FCM) extracted in a pulse-like manner. The FCM detection signal is multiplied by the PLL 113, to thereby generate the clock signal 124.

Meanwhile, the MO signal reproduced from the optical disk 101 by the optical head 102 has its amplitude controlled by the AGC 104, then has its waveform equalized by the analog waveform equalizer 105, and then is sampled by the A/D converter 106 by using the above-described reproduced clock.

In the external clock method, however, sampling clock frequency information for sampling employs the fine clock mark reproduced from the medium for reproducing data. Accordingly, since the detection system for detecting the fine clock mark 123 and the detection system for detecting the MO signal 120 are physically different, there is a phase difference between the reproduced clock 124 and a signal 125 resulting from the waveform-equalization of the MO signal 120. Such phase difference is required to be adjusted for achieving optimum sampling of the reproduction signal.

FIG. 3 is a drawing showing a reproduction signal processing part of the reproduction system of the conventional data reproduction apparatus shown in FIG. 1, in which the above-described phase difference is adjusted by using the reproduction signal processing part. In FIG. 3, like components are denoted by like numerals as of those of FIG. 1.

As shown in FIG. 3, a sampling signal, being waveform-equalized by the digital waveform equalizer 107, is sent to an ML (Maximum Likelihood) decoder 108. Then, the above-described phase difference is detected by the phase difference detector 110 based on the signal decoded by the ML decoder 108. Then, the delay of the clock output from the PLL 113 is changed by the analog delay in accordance with phase difference information obtained from the phase difference detector 110. As a result, the phase of the external clock 126 is synchronized to an optimum phase for sampling the MO signal 125 being waveform-equalized by the analog waveform equalizer 105, and waveform-equalized MO signal 125 is sampled with the external clock 126 by an appropriate phase. Accordingly, the waveform-equalized MO signal 125 is sampled with an optimum sample clock.

Meanwhile, owing to the remarkable advances in data signal processing methods using, for example, encoding technology, data can be demodulated and decoded even in a case where the Signal to Noise (SN) ratio of the reproduction signal is low. However, it is still difficult to execute phase lock adjustment between an optimum sampling point of a reproduction signal and a clock for sampling the reproduction signal, for example, in a case where the SN ratio of the reproduction signal is low or a case where the signal amplitude changes. In order to execute phase adjustment with more accuracy, the conventional example has a problem of requiring a large amount of space on the information medium for phase adjustment. In addition, there is also a problem of increasing size of the detection circuit for detecting phase difference with high accuracy.

Furthermore, conventionally, the header of data is detected with an ODC (Optical Disk Controller) after decoding is executed with a PRML (Partial Response Maximum Likelihood) detection method. However, in employing turbo code, which is being considered for application to magnetic recording systems, the header of reproduced data is required to be obtained with accuracy prior to decoding of data for executing block encoding and decoding. Therefore, in a system using the turbo code, the header of data reproduced from an information medium is required to be reliably detected without deviation of data of a single clock.

SUMMARY OF THE INVENTION

In light of the foregoing, it is an object of the present invention to provide a phase difference correction apparatus and a data reproduction apparatus including a data header detection apparatus that can synchronize the phase between a clock for reproducing data and an optimum sampling point of a reproduction signal with high accuracy and thus precisely detect a header of reproduced data even in a case where the S/N ratio of a signal is low.

In order to achieve the object, the present invention:

(1) writes an area for allowing phase difference detection and data header detection at the same time onto an area of an information medium;

(2) samples a reproduction signal reproduced from the information medium with an A/D converter using a clock that is not phase synchronized, and executes computation for obtaining a cross-correlation signal between the sampled reproduction signal and a predetermined pattern;

(3) detects phase difference between the reproduction signal and the sampled clock, and a data header from a signal resulting from the cross-correlation computation and a signal from a differentiation of the resulting signal;

(4) executes phase adjustment, based on the phase difference information detected in (3), by selecting a coefficient of a digital FIR (Finite Impulse Response) filter, and performing interpolation-filtering on the sampled reproduction signal with the digital FIR filter for attaining a correct phase; or (5) executes feedback control, based on the phase difference information detected in (3), by changing the amount of delay of a sample clock with a delay for attaining an optimum sample clock for the clock of the A/D converter that samples the reproduction signal; and (6) provides decode start information to a decoder based on the phase difference information detected in (3).

Accordingly, compared to the conventional art, phase adjustment and data header detection of high accuracy can be performed without being affected by amplitude change under a condition where S/N ratio is low.

BRIEF DESCRIPTION OF THE DRAWINGS

Further objects, features and advantages of the present invention will become more apparent from the detailed description and the accompanying drawings.

FIG. 2A is a drawing showing a fine clock mark on a disk;

FIG. 2B is a drawing showing a disk format extracted from a single track;

FIG. 2C is a drawing showing a principle for generating an external clock signal from a fine clock mark;

DESCRIPTION OF THE PREFERRED EMBODIMENTS

Embodiments of the present invention are described below with reference to the drawings.

Figure 4:
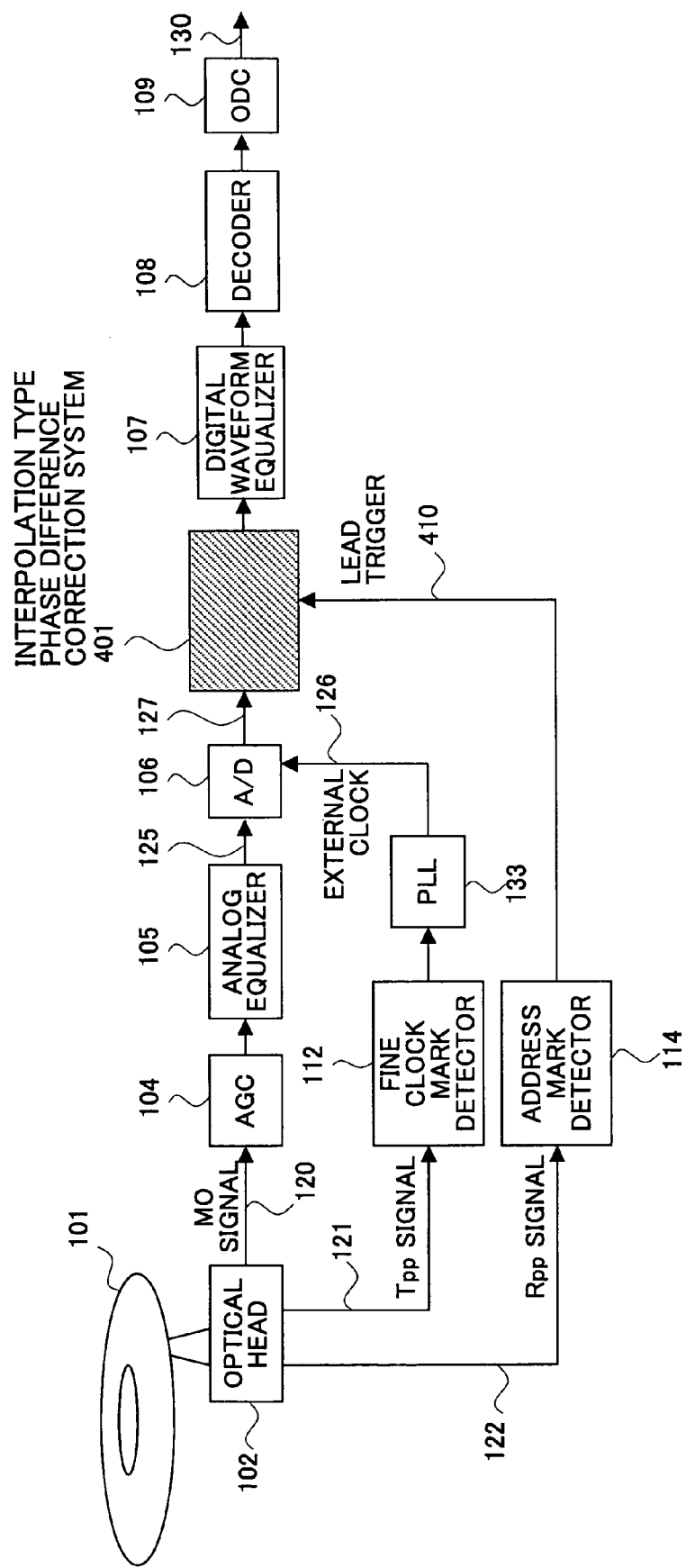
FIG. 4 is a drawing showing a first embodiment of a configuration of a data reproduction apparatus of the present invention.

A first embodiment of a configuration of a data reproduction apparatus using the present invention is shown in FIG. 4. In FIG. 4, like components are denoted with like numerals as of those in FIG. 1.

Figure 5:
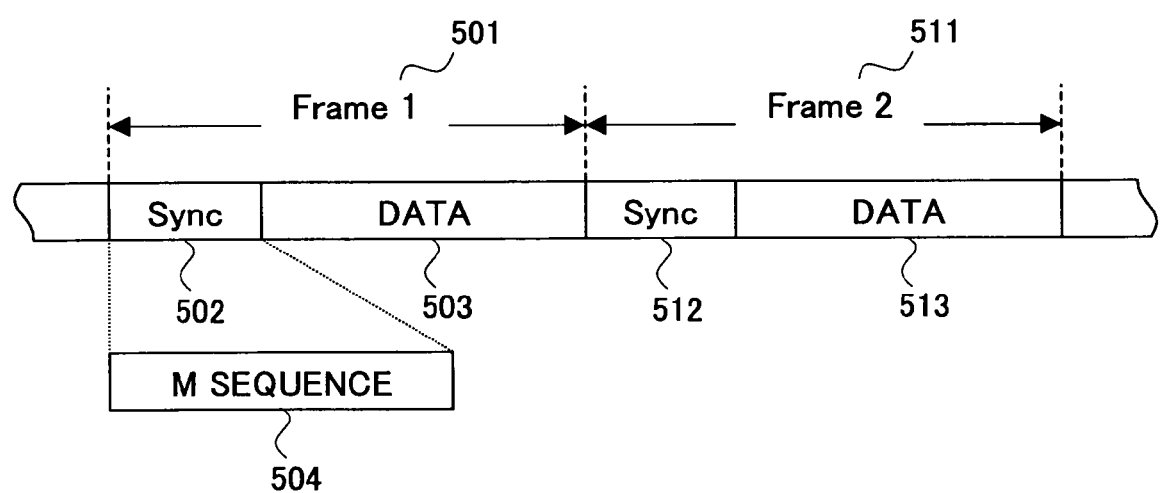
FIG. 5 is a drawing showing an embodiment of a format of a recording signal.

An embodiment of a format of a recording signal is shown in FIG. 5. As shown in FIG. 5, the recording signal is formed of plural frames 501, 511. Each frame 501 is formed of a synchronizing signal (Sync) 502 and a data signal (DATA) 503. In order to compute a correlation between a reproduced synchronizing signal (Sync) 502 and a predetermined synchronizing signal pattern, the format of the recording signal assumes the synchronizing signal (Sync) 502 as data with large autocorrelation when there is a match of pattern. For example, an M sequence (Maximum sequence) is employed as the synchronizing signal (Sync) 502. In addition, in order to prevent crosstalk among adjacent tracks, feedback types of the feedback register generating the M sequence are differently selected for each track so that the code correlation of the synchronizing signal (Sync) 502 between adjacent tracks can be reduced.

Figure 1:
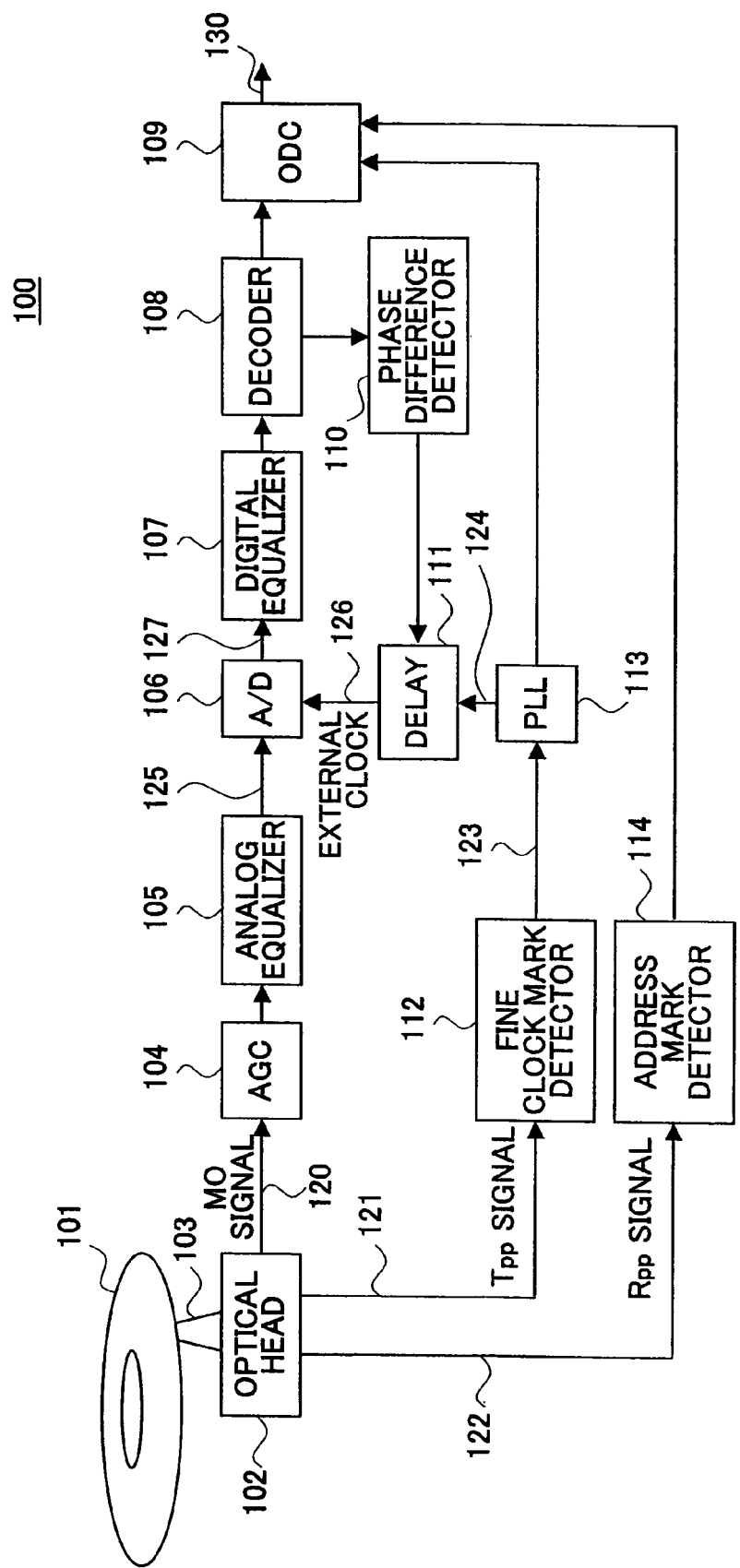
FIG. 1 is a drawing showing a block diagram of a reproduction system of a conventional data reproduction apparatus.
Figure 3:
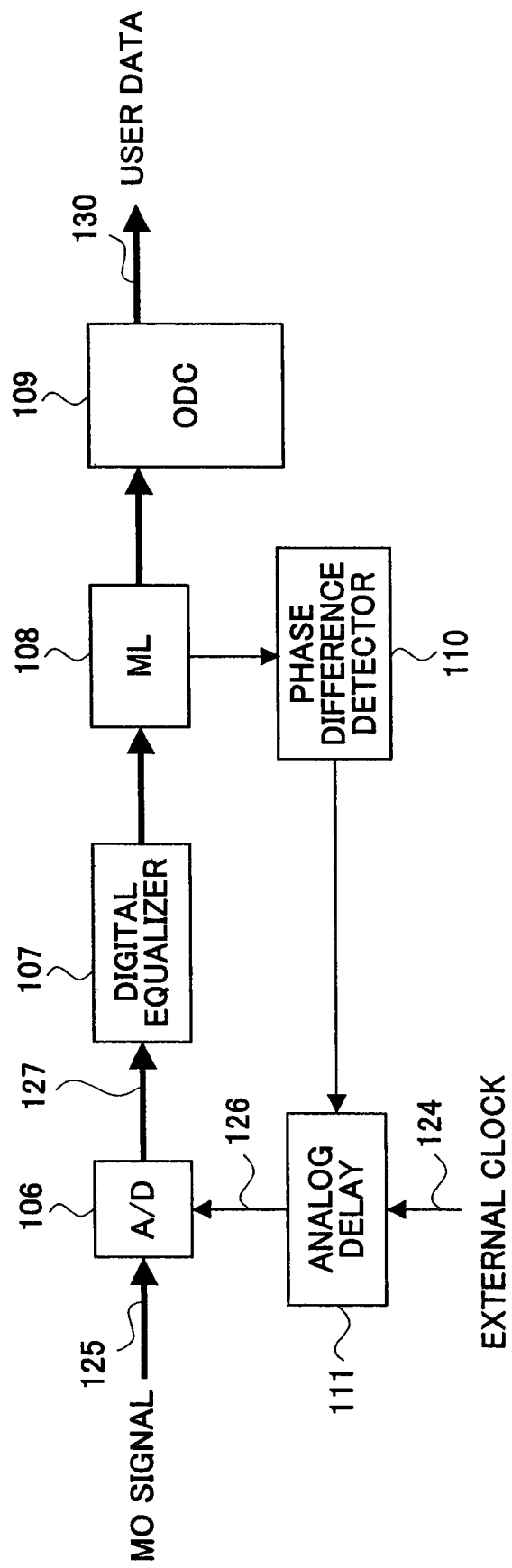
FIG. 3 is a drawing showing a reproduction signal processing part.

With respect to the conventional data reproduction apparatus shown in FIG. 1, the first embodiment of the configuration of the data reproduction apparatus of the present invention shown in FIG. 4 additionally includes a correction type phase difference correction system 401 between the A/D converter 106 and the digital waveform equalizer 107.

In the data reproduction apparatus of the present invention shown in FIG. 4, the MO signal 120, after passing the AGC 104 and the analog waveform equalizer 105, is subject to A/D conversion with an external clock 126 not synchronizing with the optimum sampling point of a signal 125 output from the analog waveform equalizer 105. A sampled signal 127, being A/D converted by the A/D converter 106, is supplied to an interpolation type phase difference correction system 401 of the present invention. Here, the signal is subject to phase difference correction and data header detection adjustment and is output.

The signal, being subject to phase difference correction, is waveform-equalized by a digital waveform equalizer 107, is then decoded by a decoder 108, is sent to an ODC 109, and is output from the ODC 109 as user data 130.

Figure 6:
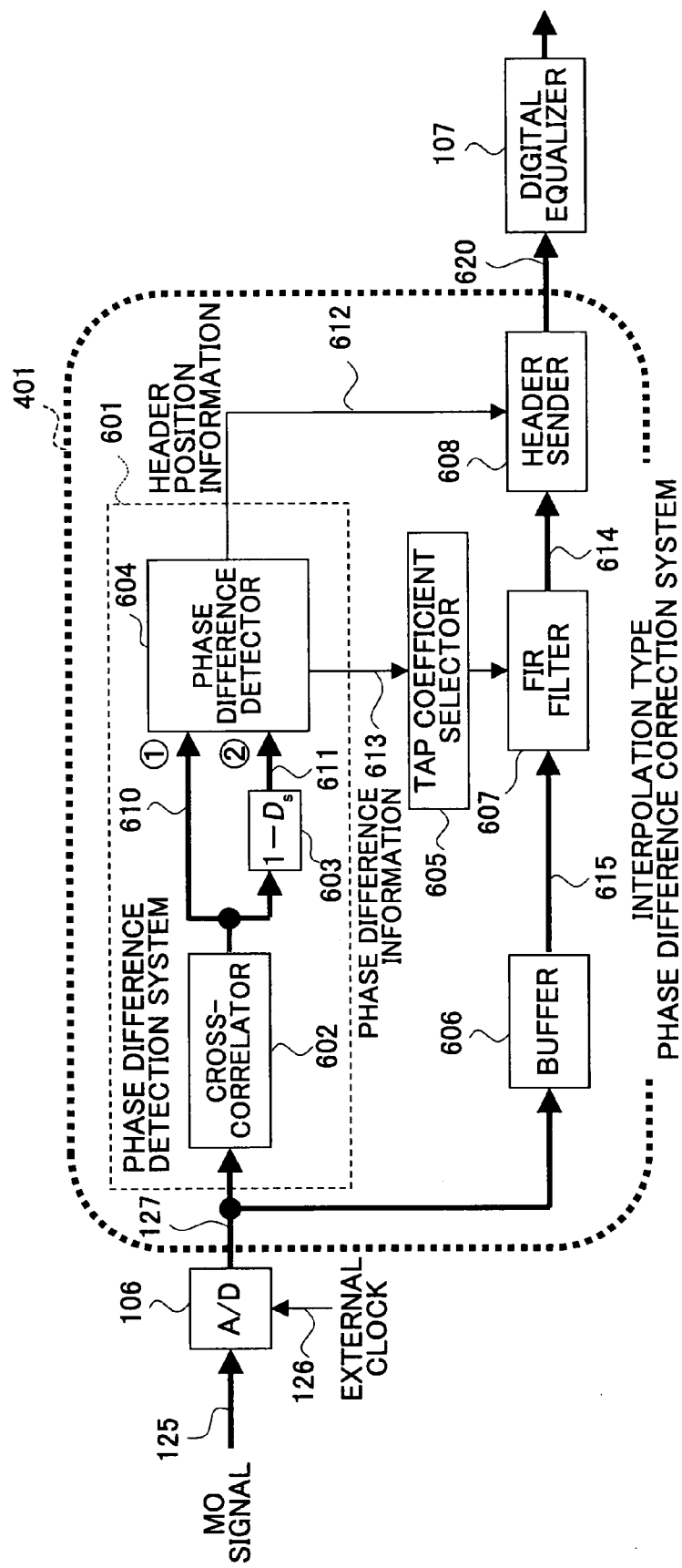
FIG. 6 is a drawing showing an embodiment of a configuration of an interpolation type phase difference correction system.

FIG. 6 is a drawing showing an embodiment of a configuration of the interpolation type phase difference correction system 401 of the present invention shown in FIG. 4.

The interpolation type phase difference correction system 401 shown in FIG. 6 mainly includes a phase difference detection system 601, an FIR filter 607 for performing interpolation correction on the sampled signal based on phase difference information, a tap coefficient selector 605 of the FIR filter, a buffer 606 for delaying input to the FIR filter 607, and a header sender 608. From the aspect of function, it is divided into the phase difference detection system 601 and the FIR filter 607.

The phase difference detection system 601 is formed of a cross-correlator 602, a differentiator 603, and a phase difference detector 604.

The waveform-equalized MO signal 125, being reproduced by the optical head 102 from the optical disk 101 shown in FIG. 4, is sampled by the A/D converter 106 using the external clock 126. Then, the sampled signal 127 is input to the phase difference detection system 601. The sampled signal 127 input to the phase difference detection system 601 is input to the cross-correlator 602 and also input to the buffer 606.

Figure 7:
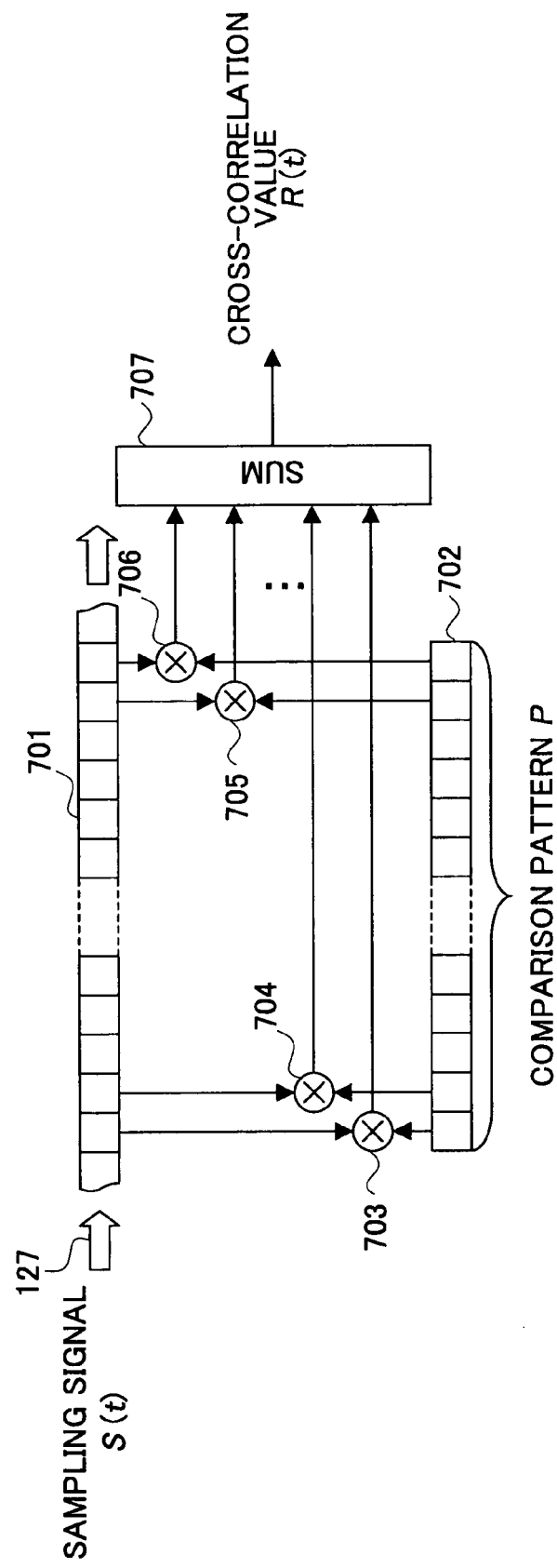
FIG. 7 is a drawing showing an embodiment of a configuration of a cross-correlator.

FIG. 7 is a drawing showing an embodiment of a configuration of the cross-correlator 602. The cross-correlator 602 includes a shift register 701, a register 702 for storing a pattern P of a reference synchronizing signal, multipliers 703, 704, 705, 706, and a summator 707 for computing the sum of the outputs of each of the multipliers. The cross-correlator 602 performs cross-correlation computation on the sampled signal 127 by using the below-described formula. Here, "R" is the cross-correlation value, "S" is the sampled signal, "P" is the pattern of the synchronizing signal (Sync) 502, "T" is the interval of the external clock 126, and "L" is the length of the pattern of the synchronizing signal (Sync).

$$R(t) = \int_0^L S(t - \tau T) P(\tau T) d\tau$$

That is, the sample value stored in each part of the shift register 701 and the value of pattern of the reference synchronizing signal stored in each part of the register 702 are multiplied by the multipliers 703, 704, 705, and 706. Then, the summator 707 computes the sum of the outputs of the multipliers 703, 704, 705, and 706. The sum is output as the cross-correlation value R.

The cross-correlation value R (see reference number 610 in drawing) output from the cross-correlator 602 and the computed value R' (see reference number 611 in drawing) of the differential value (1-Ds, in which Ds represents delay of one sample clock) of cross-correlation value R differentiated by differentiator 603 are sent to the phase difference detector 604.

The phase difference detector 604, while the cross-correlation comparison gate is open for phase detection, computes phase difference information 613 and header position information 612.

Figure 8:
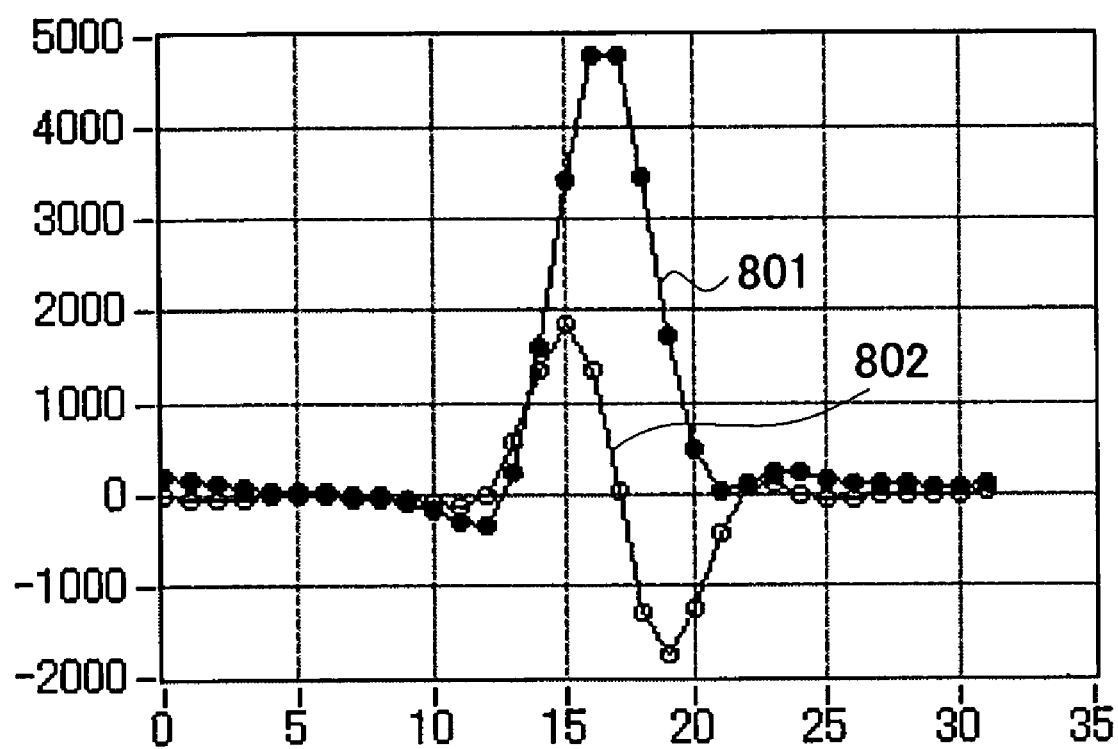
FIG. 8 is a drawing showing a relation between a cross-correlation value and a computed differential value thereof.

Here, a concept of phase difference detection is described. FIG. 8 is a drawing showing a relationship of a cross-correlation value, between the sample value of the synchronizing signal (Sync) 502 and the pattern P of the reference synchronizing signal, and its computed differential value. The horizontal axis of FIG. 8 indicates sampling time, and the relationship between the above-described cross-correlation value and its computed differential value is shown. In the drawing, the black circle (●) indicates the cross-correlation value, and the white circle (○) indicates the results of computing differential with respect to the cross-correlation value. In FIG. 8, since the differential value shows the amount of change between two points, the differential value of the cross-correlation value delays up to an amount of ½ $T_s$ ($T_s$ is the interval of a sample clock) from the cross-correlation value. Furthermore, the computed differential value of the cross-correlation value becomes zero at an area where the amount of change of the cross-correlation value changes from positive (or negative) to negative (or positive).

Figure 9A:
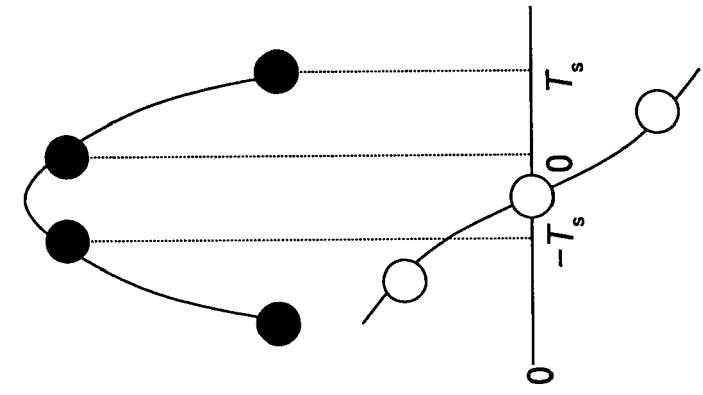
FIG. 9A is a drawing showing a relation 2 between a cross-correlation value and a computed differential value thereof in a case where the phase difference is 0%.
Figure 9B:
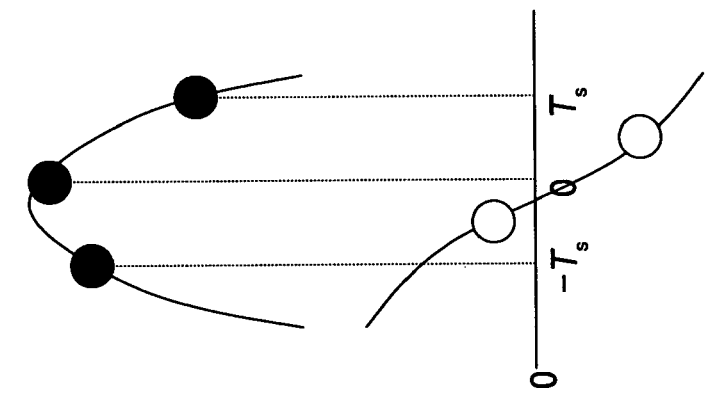
FIG. 9B is a drawing showing a relation 2 between a cross-correlation value and a computed differential value thereof in a case where the phase difference is 25%.
Figure 9C:
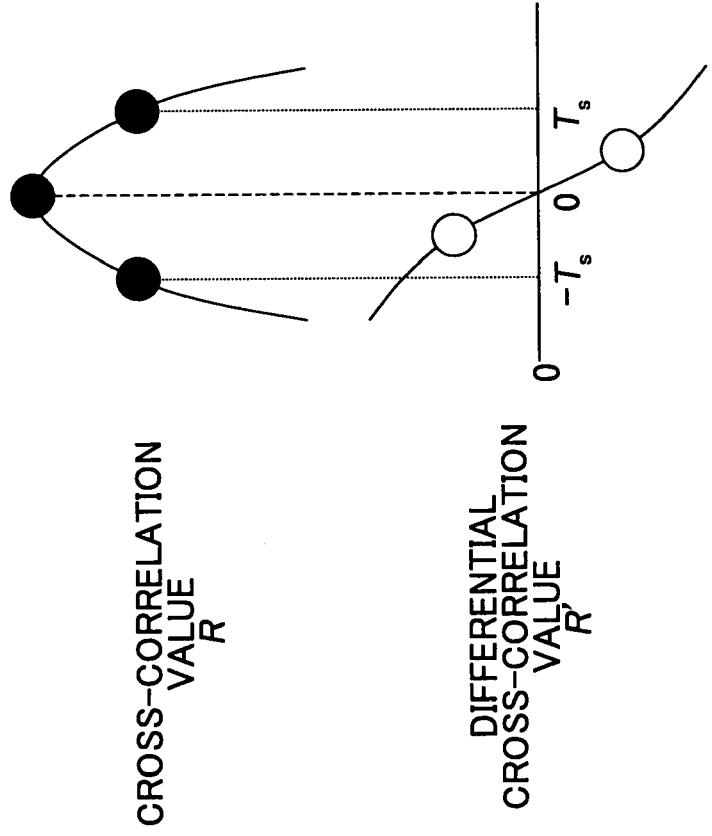
FIG. 9C is a drawing showing a relation 2 between a cross-correlation value and a computed differential value thereof in a case where the phase difference is 50%.

FIG. 9A is a drawing showing a relation between the cross-correlation value and the computed differential value in a case where the phase difference is 0%. FIG. 9B is a drawing showing a relation between the cross-correlation value and the computed differential value in a case where the phase difference is 25%. FIG. 9C is a drawing showing a relation between the cross-correlation value and the computed differential value in a case where the phase difference is 50%. The same as FIG. 8, the black circle (●) indicates the cross-correlation value, and the white circle (○) indicates the results of computing differential with respect to the cross-correlation value.

Accordingly, the maximum value of the cross-correlation value is detected, and then computation with a formula shown below is performed with the computed differential value at that point and the computed differential value at the next sample clock, thereby obtaining phase difference information p.

$$p = \frac{R'(t - T_s)}{R'(t - T_s) - R'(t)} \cdot \frac{x}{T_s} - \frac{1}{2} \cdot \frac{x}{T_s}$$

However, $x/T_s$ indicate the resolution of a single sample interval.

Accordingly, the optimum phase difference can be detected. Further, the maximum value of the cross-correlation value becomes the header position information h.

Figure 10:
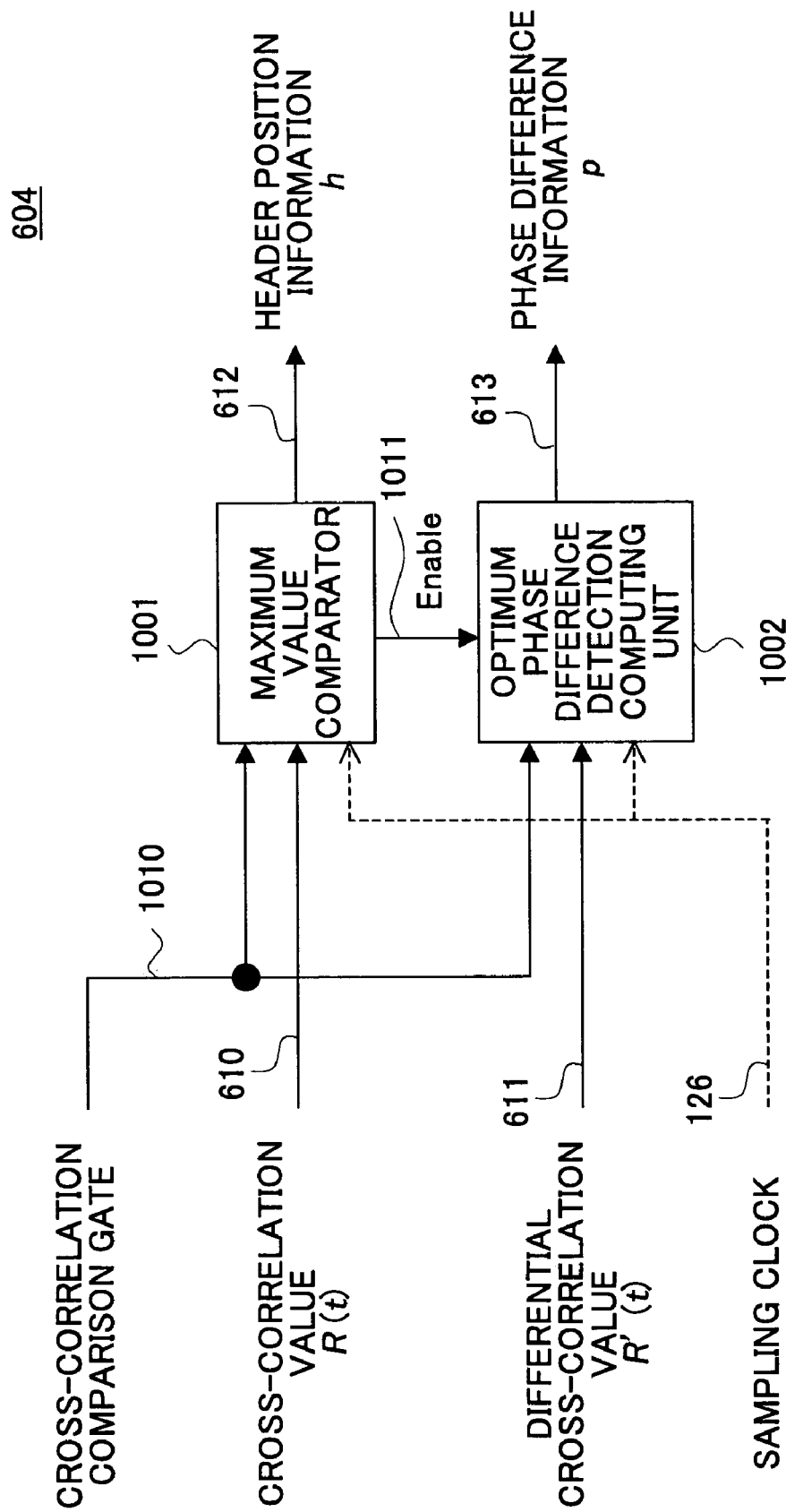
FIG. 10 is a drawing showing a block diagram of an embodiment of a configuration of a phase difference detector.

FIG. 10 is a drawing showing a block diagram of an embodiment of a configuration of the phase difference detector 604. The phase difference detector 604 mainly includes a maximum value comparator 1001 and an optimum phase difference detection computing unit 1002. The phase difference detector 604 operates while the cross-correlation comparison gate 1010 is open. The cross-correlation comparison gate 1010 and the cross-correlation value 610 are input to the maximum value comparator 1001. At a point when the value of the cross-correlation value 610 becomes larger than the prior maximum value or when the maximum value is updated, the maximum value comparator 1001 updates and outputs the header position information h (612) and thus outputs an enable signal 1011 to the optimum phase difference detection computing unit 1002. The cross-correlation comparison gate 1010, the differential cross-correlation value 611, and the enable signal 1011 are input to the optimum phase difference detection computing unit 1002. The phase difference information p is computed from the differential cross-correlation value 611 with the above-given formula.

Next, at the point when the cross-correlation comparison gate 1010 is closed, the header information h (612) and the phase difference information p (613) are respectively latched by the maximum value comparator 1001 and the optimum phase difference detection computing unit 1002.

Next, the sampled signal stored in the buffer 606 shown in FIG. 6 is read out, and provided to the FIR filter 607 shown in FIG. 6. Meanwhile, the phase difference information 613, being output by the optimum phase difference detection computing unit 1002, is supplied to the tap coefficient selector 605 shown in FIG. 6 to select the tap coefficient for the FIR filter 607.

The sampled signal read out from the buffer 606, based on the phase difference information 613 output from the optimum phase difference detection computing unit 1002, is interpolated to a correct sampling point by the FIR filter 607 with the tap coefficient selected by the tap coefficient selector 605, thereby executing phase adjustment.

Here, an exemplary case of executing interpolation phase adjustment in accordance with a Nyquist function with a cosine roll-off characteristic is shown. The Nyquist function with the cosine roll-off characteristic is indicated with the following formula.

$$r(t) = \frac{\sin(\pi t/T_s)}{\pi t/T_s} \cdot \frac{\cos(\pi \beta t/T_s)}{1-(2\beta t/T_s)^2}$$

However, $r(0) \neq 0$, $r(mT_s)=0 : m=\pm 1, \pm 2 \ldots$

In this case, tap coefficients $k_0$, $k_1$, $k_2$, $k_3$, and $k_4$ are provided as below, respectively.

$$r\left(-2T_s + p\frac{T_s}{x}\right), r\left(-T_s + p\frac{T_s}{x}\right), r\left(p\frac{T_s}{x}\right), r\left(T_s + p\frac{T_s}{x}\right), r\left(2T_s + p\frac{T_s}{x}\right)$$

However, the tap count is 5.

In a case of executing with an actual circuit, a large scale circuit is required for executing the foregoing computation. Accordingly, tap coefficients are preferred to be prepared in a number corresponding to the resolutions beforehand and used by selecting from among these.

Figure 11:
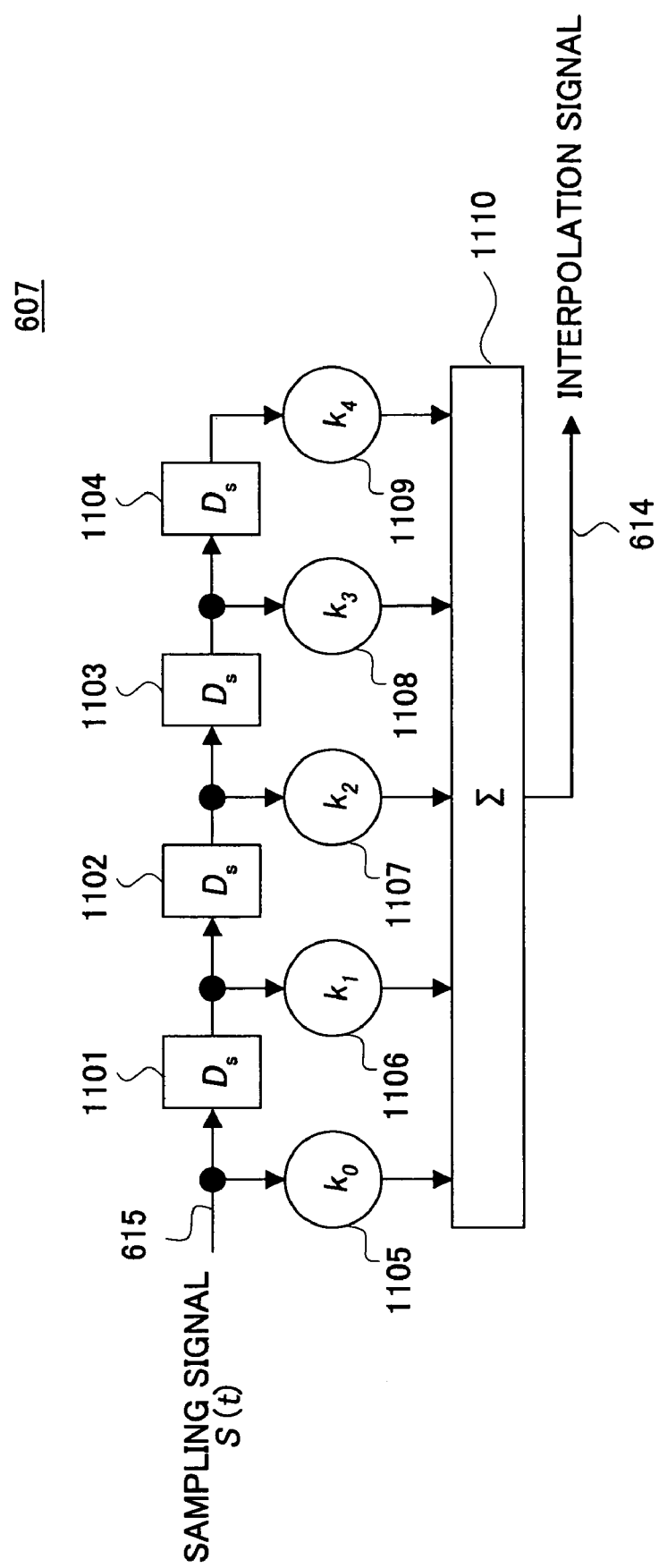
FIG. 11 is a drawing showing an embodiment of a configuration of an FIR filter.

FIG. 11 is a drawing showing an embodiment of a configuration of the FIR filter 607. The FIR filter 607 of FIG. 11 mainly includes registers 1101–1104, coefficient multiplier parts 1105–1109, and an adder part 1110 for computing the sum of the outputs of the coefficient multiplier parts 1105–1109. The above-described tap coefficients are provided to each of the coefficient multiplier parts 1105–1109 in the FIR filter 607 shown in FIG. 11 to execute interpolation phase adjustment for the sampled signal 615 output from the buffer 606. Furthermore, the reproduction signal 614, being subjected to the interpolation phase adjustment of the FIR filter 607, is sent to the header sender 608 shown in FIG. 6.

The header sender 608 sends out a synchronizing signal (Sync) as an output signal 620 based on the header position information 612 output from the phase difference detection system 601 and subsequently outputs data from the top.

Figure 12:
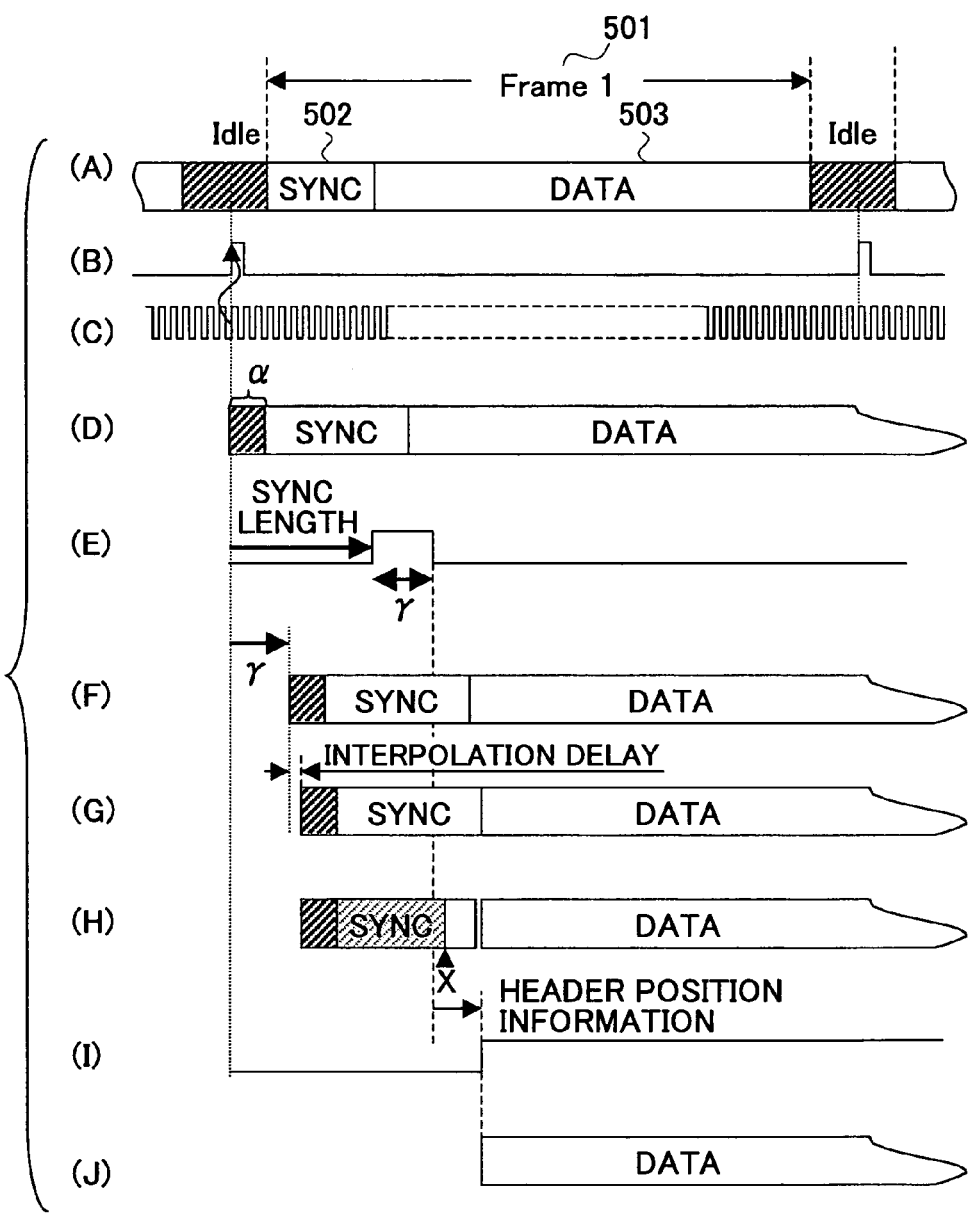
FIG. 12 is a drawing showing a timing chart of an embodiment of the present invention.

Next, operations timing of the present invention is described. FIG. 12 is a drawing showing a timing chart of an embodiment of the present invention.

The MO signal 125 (A) of FIG. 12 is an MO signal 125 which is reproduced by the optical head 102 from the optical disk 101 and supplied to the A/D converter 106 via the AGC 104 and the analog waveform equalizer 105. The MO signal 125, the same as FIG. 5, includes plural frames 501, etc., in which each frame 501 includes a synchronizing signal (Sync) 502 and a data signal (DATA) 503.

In FIG. 12, a lead trigger 410 (B) is a trigger signal generated according to an address sync mark detected by the address mark detector 114 for recording and reproducing data, and a cross-correlation comparison gate 1010 (E) is an operations gate of the phase difference detection system 601 generated according to the lead trigger (B) for detecting phase difference information and header position information. The above-described interpolation type phase difference correction system 401 is realized by executing the operation in FIG. 12.

In FIG. 12, the lead trigger (B) is generated during an idle period of the MO signal (A), by which a lead operation is started. The MO signal (A) is sampled by the A/D converter 106 with a sample clock (C) and is output as a sampled signal (D).

Next, while the cross-correlation comparison gate (E) is open, the cross-correlator 602 executes the above-described operation. The cross-correlation comparison gate (E) continues for a period γ after a period amounting to the synchronizing signal (Sync) elapses from the rise of the lead trigger (B).

Next, a signal 615 (F), being delayed by the buffer 606, is output from the buffer 606 and is input to the FIR filter 607. As described above, the FIR filter 607 generates and outputs an interpolation sample signal (G). As a result, an optimum phase sample signal (H) is switched to an optimum phase interpolation sample value from a point X when the cross-correlation comparison gate (E) is closed.

Next, the header sender 608, in accordance with a header sender gate (I) generated according to the header position information 612, outputs optimum phase sample data 620 (J).

Figure 13:
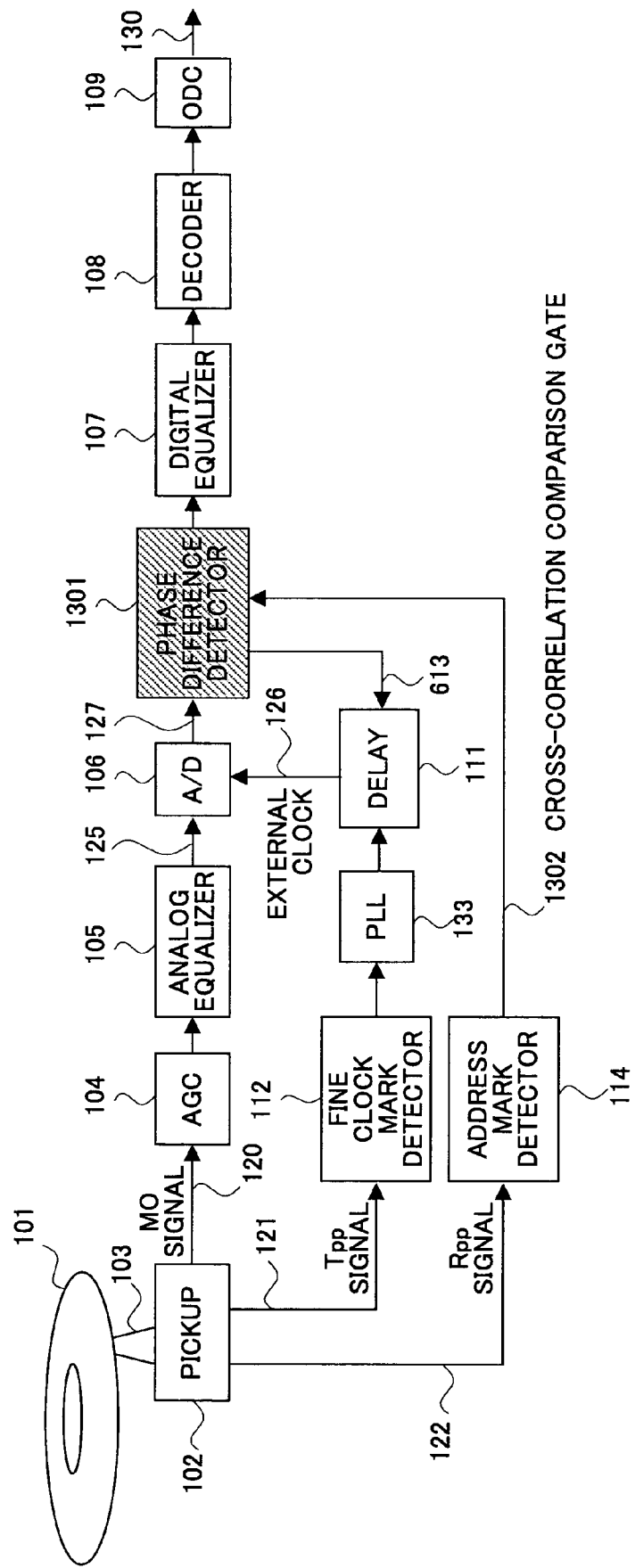
FIG. 13 is a drawing showing a second embodiment of a configuration of a data reproduction apparatus of the present invention.

Next, a second embodiment of a configuration of a data reproduction apparatus according to the present invention is described. FIG. 13 is a drawing showing the second embodiment of the configuration of the data reproduction apparatus according to the present invention. In FIG. 13, like components are denoted by like numerals as of those of FIG. 4. The configuration of the data reproduction apparatus according to the present invention shown in FIG. 13 includes a phase difference detection system 1301, in which phase delay information 613 is generated by the phase difference information detected by the phase difference detection system 1301. Furthermore, similar to FIG. 1, a phase delay 111 for delaying the sample clock is included, in which phase delay information 613 is fed back to the phase delay 111, thereby allowing the A/D converter 106 to sample the waveform-equalized MO signal with a correct phase.

Figure 14:
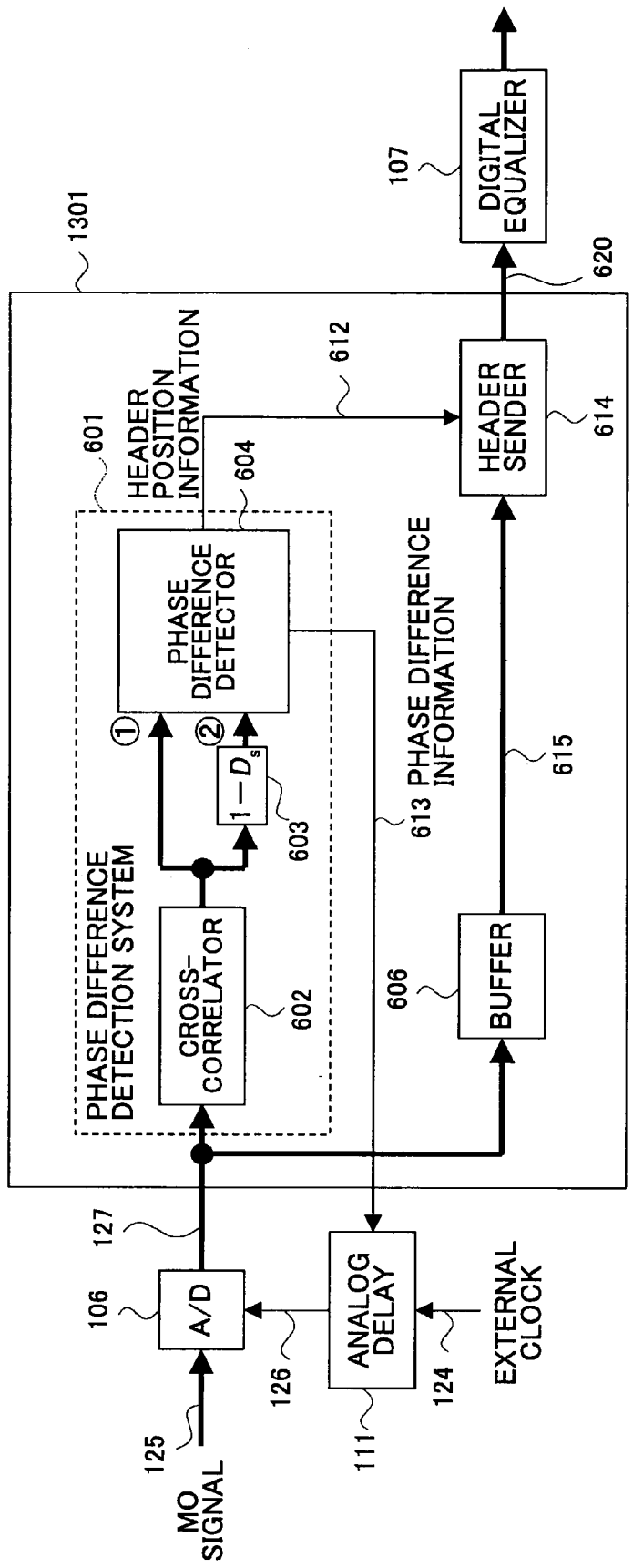
FIG. 14 is a drawing showing an embodiment of a configuration of a phase difference correction system.

An embodiment of the configuration of the phase difference detection system 1301 shown in FIG. 13 is illustrated in FIG. 14. In FIG. 14, like components are denoted by like numerals as of those of FIG. 6. The phase difference detection system 1301 shown in FIG. 14 has the tap coefficient selector 605 and the FIR filter 607 of FIG. 6 removed therefrom, and controls the phase of the external clock 126 by feeding back the phase difference information 613 output from the phase difference detector 604 to the analog delay 111. Then, the A/D converter 106 samples the MO signal 125 with a correct phase.

As described above, according to the present invention, it is an object to provide a phase difference correction apparatus and a data reproduction apparatus including a data header detection apparatus that can synchronize the phase between a clock for reproducing data and an optimum sampling point of a reproduction signal with high accuracy and thus precisely detect a header of reproduced data even in a case where the S/N ratio of a signal is low.

Further, the present invention is not limited to these embodiments, but various variations and modifications may be made without departing from the scope of the present invention.

What is claimed is:

1. A data reproduction apparatus for sampling a reproduction signal reproduced from an information medium with a predetermined sample clock, the data reproduction apparatus comprising:
   an A/D converter part for sampling the reproduction signal with the sample clock;
   a phase difference detection part for detecting a phase difference between an optimum sampling point of a sample signal sampled by the A/D converter part and the sample clock; and
   a phase difference correction apparatus including an optimum phase difference correction part for correcting a phase of a sampling point of the sample signal to an optimum phase by performing a cross-correlation computation according to the phase difference detected by the phase difference detection part so that the sample signal becomes a signal sampled at the optimum sampling point.

2. The data reproduction apparatus as claimed in claim 1, further comprising a data header detection apparatus including a data header detection part for detecting a header of an information data part of the sample signal sampled by the A/D converter part.

3. The data reproduction apparatus as claimed in claim 2, wherein the reproduction signal reproduced from the information medium includes foreknown predetermined patterns, immediately before an information data part, for executing phase difference detection and information data header detection, wherein the predetermined patterns are detected by the phase difference correction apparatus and the data header detection apparatus.

4. The data reproduction apparatus as claimed in claim 3, wherein the foreknown predetermined patterns are used by both the phase difference detection part and the data header detection part.

5. The data reproduction apparatus as claimed in claim 3, wherein the information medium includes a plurality of recording tracks for recording a signal, wherein the foreknown predetermined patterns, being arranged at adjacent tracks among the recording tracks on the information medium, are patterns that are independent from each other in which a correlation among the foreknown predetermined patterns is small.

6. The data reproduction apparatus as claimed in claim 1, wherein the phase difference detection part includes a cross-correlation computation part and an optimum phase difference detection part, wherein the cross-correlation computation part obtains a cross-correlation value by executing a cross-correlation computation between the sample signal and foreknown predetermined patterns, wherein the optimum phase difference detection part includes a part for detecting a point when a computed differential value of a cross-correlation value obtained from the cross-correlation computation part cuts across a zero point.

7. The data reproduction apparatus as claimed in claim 2, wherein the phase difference detection part includes a cross-correlation computation part and an optimum phase difference detection part, wherein the cross-correlation computation part obtains a cross-correlation value by executing a cross-correlation computation between the sample signal and foreknown predetermined patterns, wherein the data header detection part includes a part for detecting a point when a correlation between the sample signal and the foreknown predetermined patterns are strong, from the cross-correlation value obtained from the cross-correlation computation part.

8. The data reproduction apparatus as claimed in claim 1, wherein the optimum phase difference correction part includes an interpolation phase correction part for executing interpolation phase correction based on phase difference information obtained by the phase difference detection part.

9. The data reproduction apparatus as claimed in claim 8, wherein the interpolation phase correction part is an FIR filter for selecting or generating an interpolation coefficient based on the phase difference information obtained by the phase difference detection part, and having the interpolation coefficient as its filter coefficient.

10. The data reproduction apparatus as claimed in claim 1, wherein the optimum phase difference correction part includes an apparatus for controlling an amount of phase delay of the sample clock, wherein the apparatus for controlling the amount of phase delay delays the sample clock to an optimum phase delay amount based on the phase difference information obtained by the phase difference detection part.

11. The data reproduction apparatus as claimed in claim 1, wherein the phase difference detection part executes a phase difference detection operation only while a cross-correlation comparison gate, which is generated, based on a data position signal reproduced from the information medium, is open, stores a phase difference detection result at a point when the cross-correlation comparison gate is closed, and outputs the phase difference information.

12. The data reproduction apparatus as claimed in claim 2, wherein the data header detection part executes a data header position detection operation only while a cross-correlation comparison gate, which is generated, based on a data position signal reproduced from the information medium, is open, stores a phase difference detection result at a point when the cross-correlation comparison gate is closed, and outputs the data header position information.

* * * * *